United States Patent [19]

Sako et al.

[11] Patent Number: 4,565,943

[45] Date of Patent: Jan. 21, 1986

[54] PROCESS FOR PREPARING POLYMERIC PIEZOELECTRIC MATERIAL

[75] Inventors: Junichi Sako, Osaka; Toshiharu Yagi, Hyogo; Yoshihide Higashihata; Kouji Fukuyama, both of Osaka, all of Japan

[73] Assignee: Daikin Kogyo Co., Ltd., Osaka, Japan

[21] Appl. No.: 606,136

[22] Filed: May 2, 1984

[30] Foreign Application Priority Data

May 9, 1983 [JP] Japan .................................. 58-81480

[51] Int. Cl.$^4$ ............................................. H01L 41/08
[52] U.S. Cl. ..................... 310/357; 310/800; 361/233; 29/25.35
[58] Field of Search ................ 310/357–359, 310/311, 800; 361/233; 307/400; 264/22, 24; 29/25.35

[56] References Cited

U.S. PATENT DOCUMENTS

| | | | |
|---|---|---|---|
| 2,928,032 | 3/1960 | Daniel et al. | 310/359 X |
| 3,108,211 | 10/1963 | Allman et al. | 310/358 X |
| 3,365,633 | 1/1968 | Anderson et al. | 361/233 |
| 3,868,553 | 2/1975 | Adler | 310/358 X |
| 3,950,659 | 4/1976 | Dixon et al. | 310/359 |
| 4,089,034 | 5/1978 | Taylor et al. | 361/233 |
| 4,345,359 | 8/1982 | Micheron | 310/357 X |
| 4,356,424 | 10/1982 | Marcus | 310/357 |
| 4,375,042 | 2/1983 | Marcus | 310/357 |
| 4,389,445 | 6/1983 | Yoshida et al. | 310/800 X |
| 4,459,634 | 7/1984 | Stefanou | 361/233 |

*Primary Examiner*—Mark O. Budd
*Attorney, Agent, or Firm*—Birch, Stewart, Kolasch & Birch

[57] ABSTRACT

A process for preparing a polymeric piezoelectric material which comprises a vinylidene fluoride containing polymer, comprising applying at least two cycles of alternate electric field except a rectangular wave to the material to polarize it, by which process, the polymeric piezoelectric material is prepared at a low temperature for a short time.

22 Claims, 4 Drawing Figures

PROCESS FOR PREPARING POLYMERIC PIEZOELECTRIC MATERIAL

FIELD OF THE INVENTION

The present invention relates to a process for preparing a polymeric piezoelectric material. More particularly, it relates to a process for preparing a piezoelectric material comprising a vinylidene fluoride containing polymer by applying an alternating electric field to it to polarize the piezoelectric material.

BACKGROUND OF THE INVENTION

Piezoelectric property is a property such that crystals of a material are electrically polarized corresponding to an external stress applied to the material. With the piezoelectric property, mechanical energy can be transformed to electric energy, and vice versa. Generally, a piezoelectric constant $d_{31}$ is used to evaluate the piezoelectric property of the material and a larger piezoelectric constant means better transformation efficiency. Therefore, a material having a larger piezoelectric constant is preferred as the piezoelectric material.

Typical piezoelectric materials are roughly classified into ceramics (e.g. $PbTiO_3$, $BaTiO_3$, etc.) and polymers. Although ceramics have a large piezoelectric constant, they have some drawbacks in that they are less flexible, heavy, easily cracked and difficultly made into a thin film. Due to these drawbacks, their applications are restricted despite of their large piezoelectric constant.

On the contrary, polymeric piezoelectric material has a smaller piezoelectric constant than ceramics. However, polymeric material can be made into a thin film having a large surface area and mass produced.

Among the polymers, generally fluorine-containing crystalline polymers, for example, vinylidene fluoride containing polymers have a comparatively large piezoelectric constant. Recently, fluorine-containing polymers are, therefore, used in an acoustic field as a component of a head phone or a loudspeaker for high frequency. Further, composite materials having both characteristics of ceramics and the polymer are developed and used as, for example, a sensor.

The piezoelectric material, whether it is ceramic or a polymer, must be polarized to make it piezoelectric. A thermal electret method is the most common method for polarization of the material it and comprises vacuum metallizing both surfaces of the material with metal such as aluminum to form electrodes, heating it at a high temperature, for example at 130° C., applying a high electric field, for example 100 MV/m to it for a predetermined time, for example from 30 minutes to one hour, and cooling it to a room temperature under the high electric field. Since the thermal electret method requires a high electric field, long time and a high temperature, its productivity is low and it consumes a large amount of energy.

It has now been found that the vinylidene fluoride containing polymer is easily made piezoelectric at a low temperature in a short time by applying an alternating electric field (except a rectangular wave) corresponding to an electric field strength of 50 to 200 MV/m to the polymer.

SUMMARY OF THE INVENTION

According to the present invention, there is provided a process for preparing a polymeric piezoelectric material which comprises a vinylidene fluoride containing polymer, comprising applying at least two cycles an of alternating electric field except a rectangular wave to the material to polarize it.

DETAILED DESCRIPTION OF THE INVENTION

The material to be polarized according to the invention may be any one that shows a current peak due to the polarization in the voltage-current characteristic curve. Practically, examples of the material showing such peak are vinylidene fluoride containing polymer, particularly vinylidene fluoride//trifluoroethylene copolymers.

Specific examples of the vinylidene fluoride containing polymer are polyvinylidene fluoride, a vinylidene fluoride/tetrafluoroethylene copolymer and a vinylidene fluoride/trifluoroethylene copolymer. The vinylidene fluoride/trifluoroethylene copolymer includes not only a copolymer consisting of said two monomeric compounds but also a copolymer comprising said two compounds and further at least one other comonomer such as tetrafluoroethylene, chlorotrifluoroethylene, hexafluoropropylene, etc. Among them, a copolymer comprising 40 to 85% by mole of vinylidene fluoride and 60 to 15% by mole of trifluoroethylene is preferred.

In addition, a composite of the polymer and powdery ceramics (e.g. PZT) may be polarized by the process of the present invention so far as it shows a current peak due to the polarization in the electric field strength-current characteristic curve.

Figure 1:
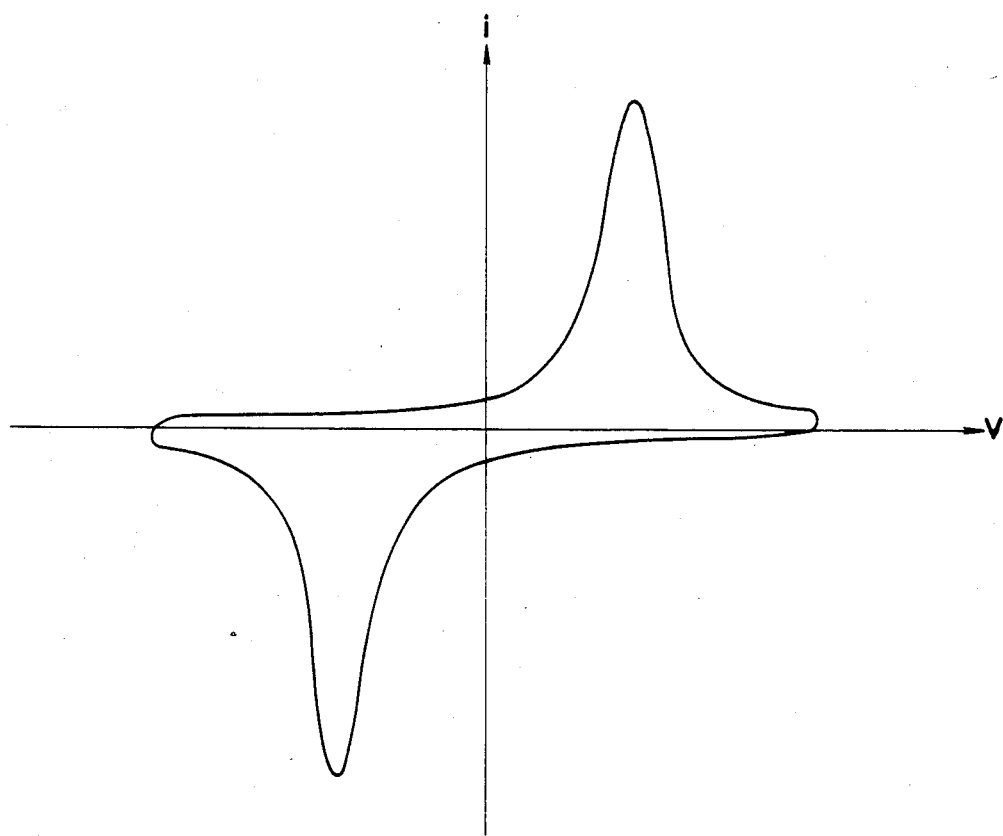
FIG. 1 is a typical voltage-current characteristic curve observed during the polarization of the material according to the invention.
Figure 2:
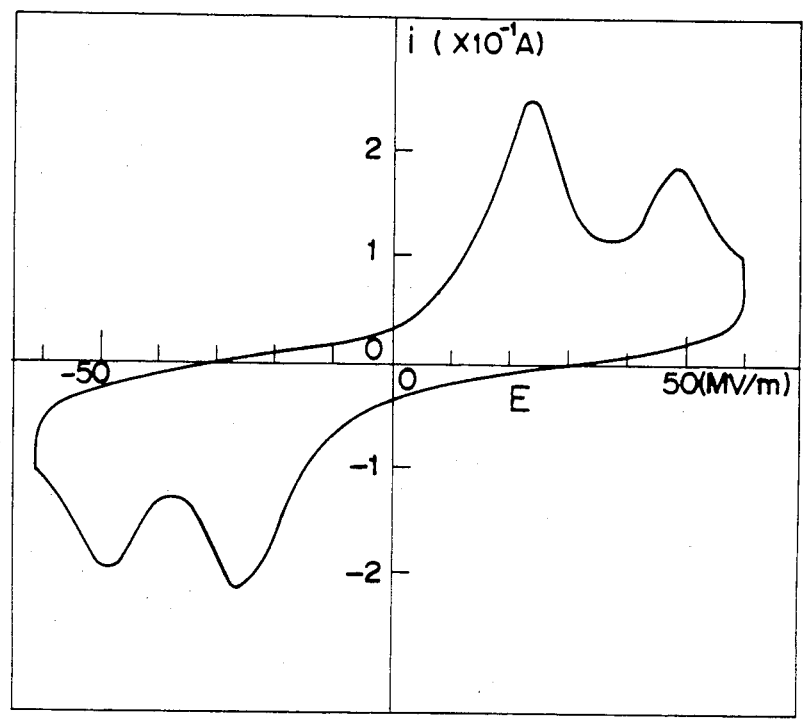
FIG. 2 is an electric field strength-current characteristic curve for a heat-pressed film having two peaks in the curve.

Typical waveforms of the alternating electric field to be employed in process of the invention is a triangular wave, which is preferred, a sawtooth wave, a sine wave. FIG. 1 shows a typical electric field strength-current characteristic curve showing the polarization of the material induced by the application of the alternating electric field. As is apparent from FIG. 1, the current peak due to polarization is observed and the piezoelectric property is induced in the material in the first half cycle. As the alternating electric field is repeatedly applied, the current peak becomes higher and the piezoelectric property is more improved. A film formed by heat-press at a temperature higher than the melting point of the material shows two current peaks in the electric field strength-current characteristic curve as shown in FIG. 2. The material showing two current peaks in the characteristic curve exhibits unsatisfactory piezoelectric property after polarization. However, by applying the alternating electric field to such material repeatedly, the two peaks merge into one and its piezoelectric property can be improved.

The electric field intensity to be applied is usually from 50 to 200 MV/m, preferably from 80 to 150

MV/m to polarize the vinylidene fluoride containing polymer, and is from 5 to 25 MV/m to polarize the composite of the polymer and ceramics. The frequency is usually from 0.1 mHz to 1 Hz, preferably from 0.1 mHz to 0.1 Hz, more preferably from 0.1 mHz to 0.01 Hz. In the conventional polarization method, 100 MV/m is the maximum electric field strength to be applied practically, since the material suffers dielectric breakdown with the electric field strength larger than 100 MV/m. On the contrary, according to the invention, a very large electric field strength can be applied.

Usually, the vinylidene fluoride containing polymer is polarized at a temperature lower than 60° C., preferably lower than 40° C., more preferably from 30° to 40° C., while the composite of the polymer and ceramics may be polarized at a temperature from a room temperature to 120° C.

According to the process of the invention, the piezoelectric material can be easily prepared at a low temperature for a short time. Further, the degree of the polarization or the degree of the breakage of the material due to a high electric field can be continuously monitored by observing the electric field strength-current characteristic curve. Such monitoring cannot be done in the conventional thermal electret method.

PREFERRED EMBODIMENTS OF THE INVENTION

The present invention will be hereinafter explained further in detail by following Examples, in which the piezoelectric constant $d_{31}$ was measured at 110 Hz by means of DDV-II-EA of Toyo Boldwin.

EXAMPLE 1

A vinylidene fluoride/trifluoroethylene copolymer containing 52.8% by mole of vinylidene fluoride was extruded to form a film having a thickness of 25 micrometers. Aluminum was vacuum metallized on both surfaces of the film to form electrodes. To one electrode, a very low frequency triangular wave having maximum voltage of 2,500 volts and frequency of 3 mHz was applied at a room temperature to polarize the film.

Figure 3:
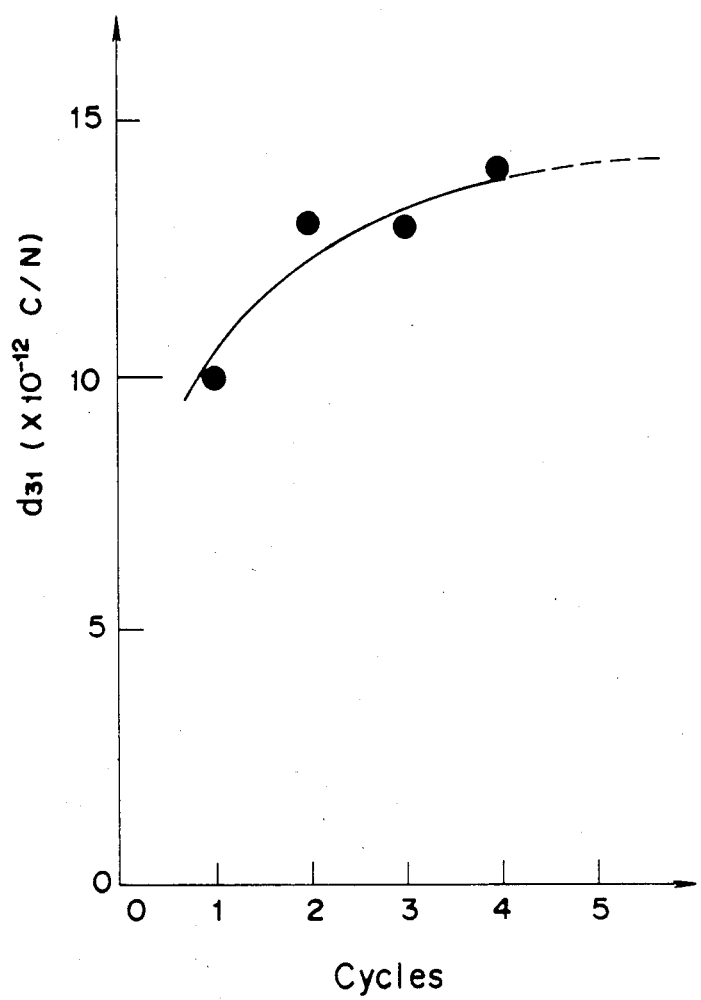
FIG. 3 is a graph showing the relationship between the piezoelectric constant $d_{31}$ and the cycles in Example 1.

The relationship between the cycles and the piezoelectric constant $d_{31}$ is shown in FIG. 3, from which it is understood that after two cycles, $d_{31}$ was about $14 \times 10^{-12}$ C/N or more.

EXAMPLE 2

To the same film as used in Example 1, the same triangular wave was applied for four cycles at a temperature between a room temperature and 80° C., and the piezoelectric constant $d_{31}$ of the polarized film was measured.

Figure 4:
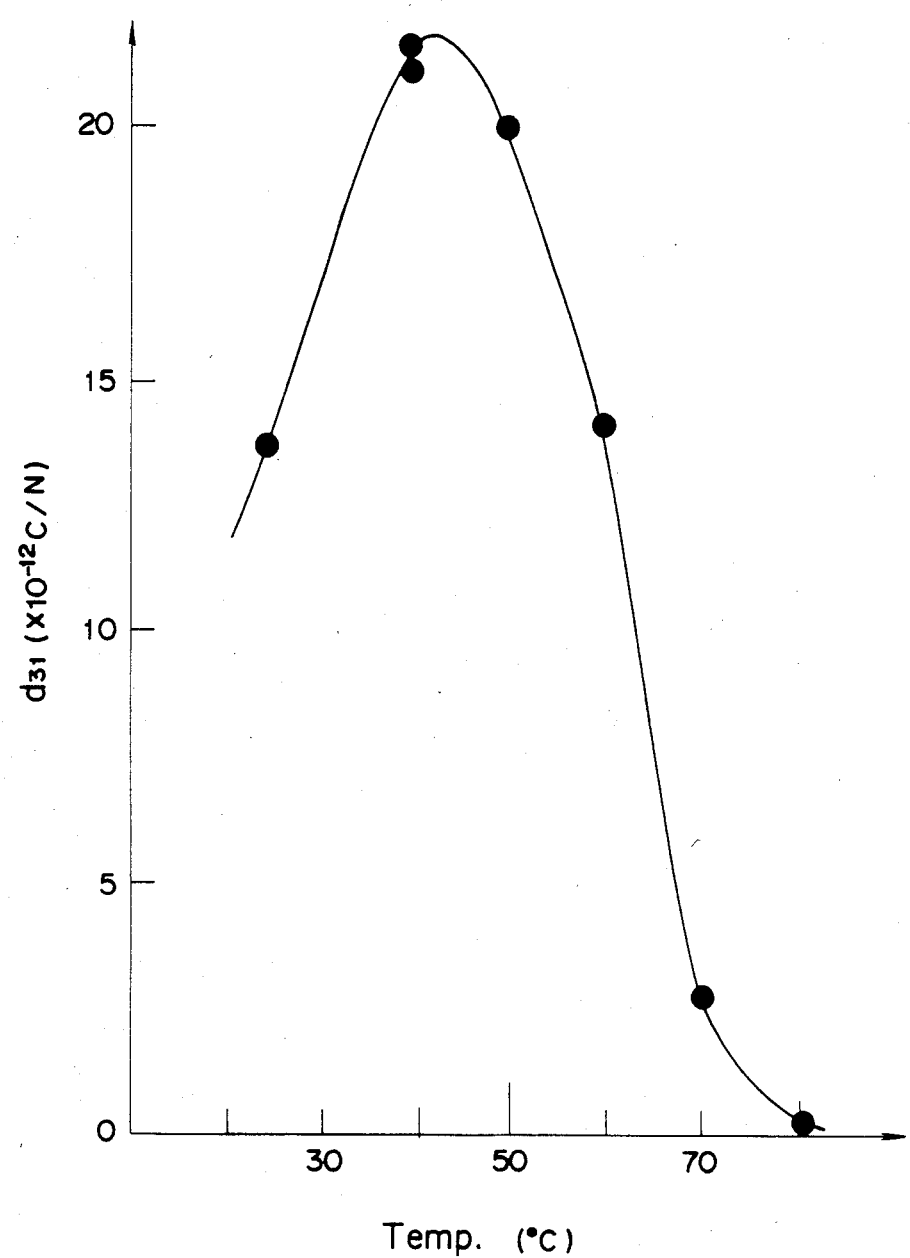
FIG. 4 is a graph showing the relationship between the piezoelectric constant $d_{31}$ and temperature in Example 2.

The results are shown in FIG. 4, from which it is understood that $d_{31}$ had a peak value of $21 \times 10^{-12}$ C/N around 40° C. which was about 1.5 times $d_{31}$ of the film polarized at a room temperature. At 80° C., the polarized film had $d_{31}$ of $0.2 \times 10^{-12}$ C/N, which means substantial loss of piezoelectric property.

COMPARATIVE EXAMPLE 1

The same film as used in Example 1 was polarized by the thermal electret method. The polarization conditions were as follows:
Electric field strength: 30 MV/m.
Time: 30 minutes.
Temperature: Room temperature (about 25° C.), 40° C., 80° C. or 120° C.
Heating or cooling rate between room temperature and polarization temperature: 1° C./min.

Each electric constant $d_{31}$ of the film polarized at various temperatures is shown in Table 1.

TABLE 1

| Temp. (°C.) | $d_{31}$ ($\times 10^{-12}$ C/N) |
|---|---|
| R.T. | 3.0 |
| 40 | 7.5 |
| 80 | 15.0 |
| 120 | 21.2 |

From these results, it is understood that the piezoelectric property is not induced in the film treated by the thermal electret method at a temperature from a room temperature to 40° C., and in order to produce a film having the same piezoelectric property as those obtained in Example 1 and in Example 2 at 40° C., the thermal electret method should be carried out with 30 MV/m at 80° C., and with 30 MV/m at 120° C. for 30 minutes respectively.

The thermal electret method takes 2 to 3 hours including the heating and cooling time and requires a high temperature of 80° to 120° C., which causes deformation of the material. Further, this method required a large amount of energy, which is economically disadvantageous.

COMPARATIVE EXAMPLE 2

A vinylidene fluoride/trifluoroethylene copolymer containing 52% by mole of vinylidene fluoride was melt formed in a film having a thickness of 30 micrometers. Aluminum was vacuum metallized on both surfaces of the film to form electrodes. To one electrode, three cycles of a rectangular wave having maximum electric field strength of ±60 MV/m and frequency of 17 mHz were applied.

The polarized film had a very low piezoelectric constant $d_{31}$ of $2.41 \times 10^{-12}$ C/N.

In this example wherein the rectangular wave was applied, any electric field strength-current characteristic curve was not observed.

EXAMPLE 3

A vinylidene fluoride/trifluoroethylene copolymer containing 54% by mole of vinylidene fluoride (10 g) was dissolved in methyl ethyl ketone (110 ml). The solution was casted on a glass plate and then the solvent was evaporated off to give a film having a thickness of 25 micrometers, a length of 2 cm and a width of 1.5 cm. The obtained film was heat treated at 135° C. for one hour. Thereafter, electrodes were formed on both surfaces of the film in the same manner as in Example 1.

To one electrode, very low frequency triangular wave having maximum voltage of 2,500 volts and frequency of 3 mHz was applied at a room temperature to polarize the film. After the first cycle, there appeared two broad peaks in the electric field strength-current characteristic curve, but they merged in one after the second cycles. A piezoelectric constant $d_{31}$ after the eighth cycle was $14.2 \times 10^{-12}$ C/N.

EXAMPLE 4

After the same cast film as prepared in Example 3 was heat pressed under 50 Kg/cm$^2$, at 230° C. for 5 minutes, it was annealed at 135° C. for one hour. Then, electrodes were formed by vacuum metallizing both surfaces with aluminum.

The sample film (23 micrometers×2.0 cm×1.5 cm) was polarized in the same manner as in Example 3.

In the electric field strength-current characteristic curve, two sharp peaks were found after two cycles. As the number of cycles increased, the two peaks approached each other and merged in one after 5 cycles.

The film showing one peak had a piezoelectric constant $d_{31}$ of $15.8 \times 10^{-12}$ C/N, while the film showing two peaks had a piezoelectric constant $d_{31}$ of $6.0 \times 10^{-12}$ C/N.

What is claimed is:

1. A process for preparing a polymeric piezoelectric material which comprises a vinylidene fluoride containing polymer, comprising:
   locating said polymer between two electrodes; and
   polarizing said polymer by applying at least two cycles of an alternating electric field, except a rectangular wave, to the polymer while said polymer is located between said two electrodes.

2. The process according to claim 1, wherein the polymeric material is a polymer selected from the group consisting of polyvinylidene fluoride, a vinylidene fluoride/tetrafluoroethylene copolymer and a vinylidene fluoride/trifluoroethylene copolymer.

3. The process according to claim 2, wherein the the polymeric material is a copolymer comprising 40 to 85% by mole of vinylidene fluoride and 60 to 15% by mole of trifluoroethylene.

4. The process according to claim 2, wherein the alternating electric field is applied at a temperature lower than 60° C.

5. The process according to claim 4, wherein the alternating electric field is applied at a temperature lower than 40° C.

6. The process according to claim 2, wherein the alternate electric field has strength of 50 to 200 MV/m.

7. The process according to claim 1, wherein the polymeric material is a composite material of the vinylidene fluoride containing polymer and ceramics.

8. The process according to claim 7, wherein the alternating electric field is applied at a temperature of a room temperature to 120° C.

9. The process according to claim 7, wherein the alternating electric field has strength of 5 to 25 MV/m.

10. The process according to claim 1, wherein the alternating electric field has a frequency of 0.1 mHz to 1 Hz.

11. A process for preparing a polymeric piezoelectric material which comprises a vinylidene fluoride containing polymer, comprising:
    locating said polymer between two electrodes; and
    polarizing said polymer by applying at least two cycles of an alternating electric field having a strength of 50 to 200 MV/m, except a rectangular wave, to the polymer while said polymer is located between said two electrodes.

12. The process according to claim 11, wherein the alternating electric field has a frequency of 0.1 mHz to 1 Hz.

13. A process for preparing a polymeric piezoelectric material which comprises a vinylidene fluoride containing polymer, comprising:
    locating said polymer in an alternating electric field; and
    polarizing said polymer by applying at least two cycles of the alternating electric field, except a rectangular wave, to each portion of the polymer.

14. A process according to claim 13, wherein the polymeric material is a polymer selected from the group consisting of polyvinylidene fluoride, a vinylidene fluoride/tetrafluoroethylene copolymer and a vinylidene fluoride/trifluoroethylene copolymer.

15. The process according to claim 14, wherein the polymeric material is a copolymer comprising 40 to 85% by mole of vinylidene fluoride and 60 to 15% by mole of trifluoroethylene.

16. The process according to claim 13, wherein the alternating electric field is applied at a temperature lower than 60° C.

17. The process according to claim 16, wherein the alternating electric field is applied at a temperature lower than 40° C.

18. The process according to claim 13, wherein the alternate electric field has strength of 50 to 200 MV/m.

19. The process according to claim 13, wherein the polymeric material is a composite material of the vinylidene fluoride containing polymer and ceramics.

20. The process according to claim 19, wherein the alternating electric field is applied at a temperature of room temperature to 120° C.

21. The process according to claim 19, wherein the alternating electric field has strength of 5 to 25 MV/m.

22. The process according to claim 13, wherein the alternating electric field has a frequency of 0.1 mHz to 1 Hz.

* * * * *